United States Patent
Yamamura

[11] Patent Number: 5,831,999
[45] Date of Patent: Nov. 3, 1998

[54] METHOD AND APPARATUS FOR CORRECTING CODE ERRORS

[75] Inventor: Ryuji Yamamura, Ogaki, Japan

[73] Assignee: Sanyo Electric Co., Ltd., Osaka, Japan

[21] Appl. No.: 814,573

[22] Filed: Mar. 10, 1997

[30] Foreign Application Priority Data

Mar. 11, 1996 [JP] Japan .................................. 8-053028

[51] Int. Cl.$^6$ ..................... H03M 13/00; H03M 13/22; G11B 20/18
[52] U.S. Cl. ..................... 371/37.4; 371/5.1; 371/37.5; 371/40.2; 371/40.14
[58] Field of Search .................................. 371/37.4, 37.5, 371/40.2, 40.14, 5.1

[56] References Cited

U.S. PATENT DOCUMENTS

| | | | |
|---|---|---|---|
| 4,532,629 | 7/1985 | Furuya et al. | 371/38 |
| 4,541,092 | 9/1985 | Sako et al. | 371/39 |
| 4,546,474 | 10/1985 | Sako et al. | 371/39 |
| 4,677,622 | 6/1987 | Okamoto et al. | 371/39 |
| 4,683,572 | 7/1987 | Baggen et al. | 371/37 |
| 4,707,805 | 11/1987 | Narusawa et al. | 364/900 |
| 5,311,522 | 5/1994 | Marakami | 371/37.4 |
| 5,453,996 | 9/1995 | Nakamura | 371/37.5 |

OTHER PUBLICATIONS

W. Wesley Peterson et al., "Error–Correcting Codes –Second Edition",Section 9, Bose–Chaudhuri–Hocquenghem Codes, pp. 269–309, The Mit Press.

*Primary Examiner*—Stephen M. Baker
*Attorney, Agent, or Firm*—Sheridan Ross P.C.

[57] ABSTRACT

Disclosed is method of correcting code errors included in digital data that are structured in unit of frames, using first and second series of parity data. The method includes computing a first group of syndromes for the digital data using the first series of parity data. Then, a number of code errors included in the digital data is primarily decided based on the first group of syndromes, and the number of code errors included in the digital data is monitored in a frame by frame manner. In addition, the method includes primarily correcting at least one code error using the first group of syndromes and affixing an error flag to the digital data based on a result of monitoring the number of code errors. Then, a second group of syndromes for the digital data is generated using the second series of parity data. The method further includes secondarily deciding a number of code errors included in the digital data based on the second group of syndromes and the error flag, and further secondarily correcting at least one code error using the second group of syndromes.

12 Claims, 6 Drawing Sheets

METHOD AND APPARATUS FOR CORRECTING CODE ERRORS

BACKGROUND OF THE INVENTION

1. Field of the Invention

The present invention relates generally to a method and apparatus for detecting and correcting code errors in digital data read from a recording medium such as a compact disks (CDs) and a mini disks (MDs).

2. Description of the Related Art

The cross-interleave Reed-Solomon code (CIRC) system that uses Reed-Solomon code is typically used in CD players to correct code errors in digital data, which occur due to CD defects or CD player mechanical malfunctions.

In CIRC systems, 16 bits audio data for the right and left channel are divided into two 8-bit symbol data that is recorded on a CD. Further, 24 pieces of symbol data corresponding to six pieces of right audio data and six pieces of left audio data are treated as single data group (one frame). Parity data that includes eight symbols which accord to the Reed-Solomon coding technique are typically added to the 24 pieces of symbol data. The 8-symbol parity data includes 4-symbol parity data of a C1 code stream and 4-symbol parity data of a C2 code stream, both parity data include four symbols. Accordingly, one recorded frame of symbol data includes 32 symbols.

As shown in FIG. 1, symbol data to be recorded is converted to 14-bit encoded data by Eight to Fourteen Modulation (EFM), a sync signal and subcode data are affixed to that encoded data and the resultant data is written on a CD as an EFM signal. Specifically, one frame of EFM signals includes 588 bits. That is, 588 bits includes a 24-bit sync signal located at the head of the frame, and 32 pieces of consecutive 14-bit data having three connection bits therebetween.

In general, EFM signals are read in a frame by frame manner from a CD, and are subjected to EFM demodulation to yield 8-bit subcode data and 32 pieces of symbol data. The subcode data is produced from the first 14-bit data following the sync signal, and the 32 pieces of symbol data are produced from 32 pieces of 14-bit data, respectively.

Japanese Patent Publication No. 5-18487 discloses code error correction according to this CIRC system. In general, 32 pieces of symbol data are first subjected to decoding using a C1 parity code stream and then subjected to decoding using a C2 parity code stream. In each decoding process, each symbol data is rearranged according to C1 codes or C2 codes and then subjected to an arithmetic operation to compute a syndrome. Using this syndrome, code error detection and correction according to the Reed-Solomon coding scheme is performed on each symbol. In this manner, 28 pieces of symbol data are acquired through the decoding process using C1 codes and 24 pieces of symbol data are acquired through the decoding process using C2 codes.

As shown in FIG. 1, 24 pieces of symbol data are restored, with two symbol data as one group, so that six pieces of 16-bit audio data corresponding to the left channel and six pieces of 16-bit audio data corresponding to the right channel may be obtained. The audio data of the right and left channels are then sent to an audio amplifier after suitable digital to analog (D/A) conversion.

Normally, the error detection and correction of two of 32 pieces of symbol data is possible in CIRC decoding using four C1 codes or C2 codes. If the position of a code error is detected using the C1 codes, four code errors may be corrected using the C2 codes. The arithmetic operations for such code error detection and correction are similarly performed for every symbol data regardless of the presence or absence of code errors. In other words, code error correcting processes are performed independently in a frame by frame manner. Unfortunately, this makes it difficult to execute accurate detection of many code errors as well as performing proper error correction of code errors. Furthermore, wasteful arithmetic operations for symbol data that contains no code errors will be performed. As such, this increases the number of code errors requiring correction, and inevitably increases power consumption for the arithmetic operation circuit.

SUMMARY OF THE INVENTION

Broadly speaking, the present invention relates to an error correcting method and apparatus that performs highly reliable error corrections while reducing power consumption levels. The present invention can be implemented in numerous ways including as an apparatus and a method.

In one embodiment, a method of correcting code errors included in digital data, structured in units of frames, using first and second series of parity data is disclosed. The method includes computing a first group of syndromes for the digital data using the first series of parity data. Then, a number of code errors included in the digital data is primarily decided based on the first group of syndromes, and the number of code errors included in the digital data is monitored in a frame by frame manner. In addition, the method includes primarily correcting at least one code error using the first group of syndromes and affixing an error flag to the digital data based on a result of monitoring the number of code errors. Then, a second group of syndromes for the digital data is generated using the second series of parity data. The method further includes secondarily deciding a number of code errors included in the digital data based on the second group of syndromes and the error flag, and further secondarily correcting at least one code error using the second group of syndromes.

In a further embodiment, the monitoring step includes the step of setting an indicator to settle an error flagging condition when digital data having code errors whose quantity exceeds a first predetermined number continues over a second predetermined number of frames, and the step of resetting the indicator to initialize a flag setting condition when digital data having code errors whose quantity is less than a third predetermined number continues over a fourth predetermined number of frames. Further, the error-flag affixing step includes a step of, when the indicator is set, an error flag to the digital data.

In yet a further embodiment, a number of code errors correctable by using the first series of parity data is limited to a first predetermined number. Further, the error-flag affixing step includes a step of affixing an error flag to the digital data, when code errors whose quantity exceeds the first predetermined number are included in the digital data.

In still a further embodiment, an apparatus for correcting code errors included in digital data, structured in units of frames, using first and second series of parity data included in the digital data is disclosed. The apparatus includes an input/output circuit for controlling input and output of digital data. A buffer memory is connected to the input/output circuit and stores the digital data. A syndrome calculator receives digital data read from the buffer memory via the input/output circuit and computes first and second groups of syndromes using the first and second series of parity data included in the digital data. The apparatus further includes a Galois field calculator for performing a first syndrome calculation using the first group of syndromes and performing a first process of correcting at least one code error using a result of the first syndrome calculation. The Galois field calculator then performs a second syndrome calculation using the second group of syndromes and performs a second process of correcting at least one code error using a result of the second syndrome calculation. A number of code errors in the digital data and a position of the at least one code error are calculated in the first and second syndrome calculations. Furthermore, the apparatus includes a control circuit for controlling operations of the syndrome calculator and the Galois field calculator, setting a condition for the first process based on the number of code errors obtained in the first syndrome calculation, and setting a condition for the second process based on the number of code errors obtained in the second syndrome calculation.

Other aspects and advantages of the invention will become apparent from the following description, taken in conjunction with the accompanying drawings, illustrating by way of example the principals of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

Figure 1:
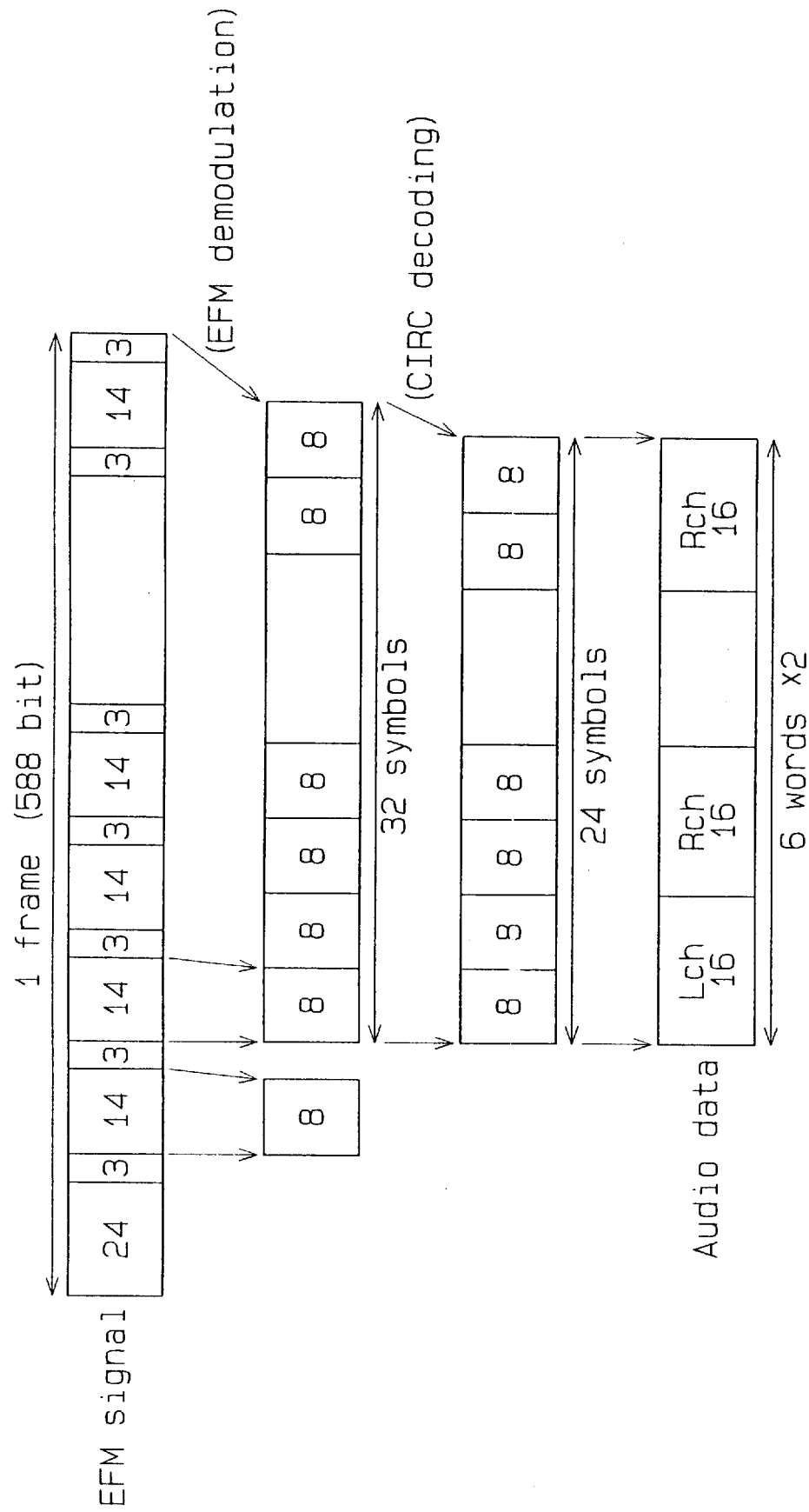
FIG. 1 illustrates data formats of data converted from a signal read from a CD to audio data.
Figure 2:
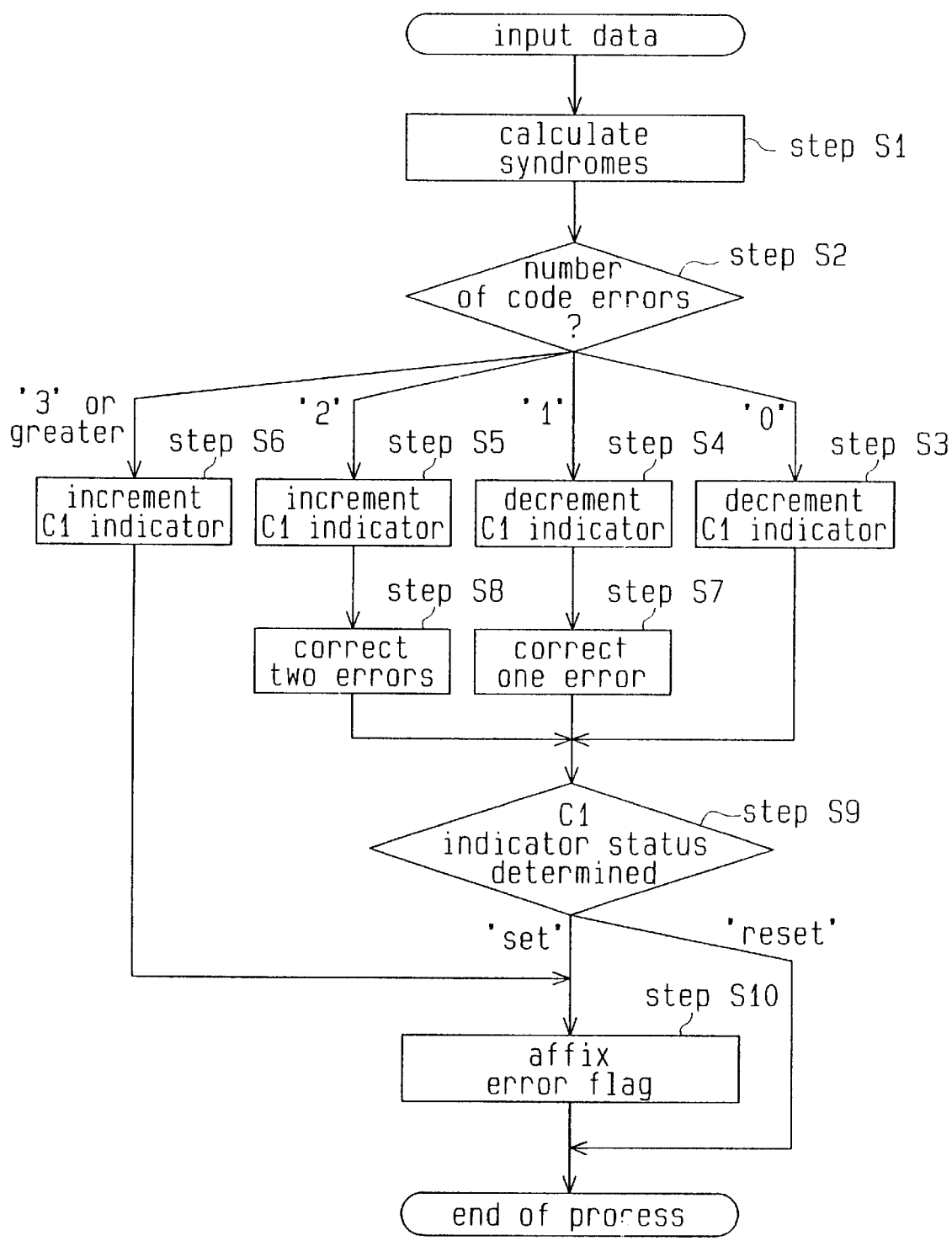
FIG. 2 is a flowchart illustrating the first processing stage in a code error correcting method according to one embodiment of the invention.
Figure 3:
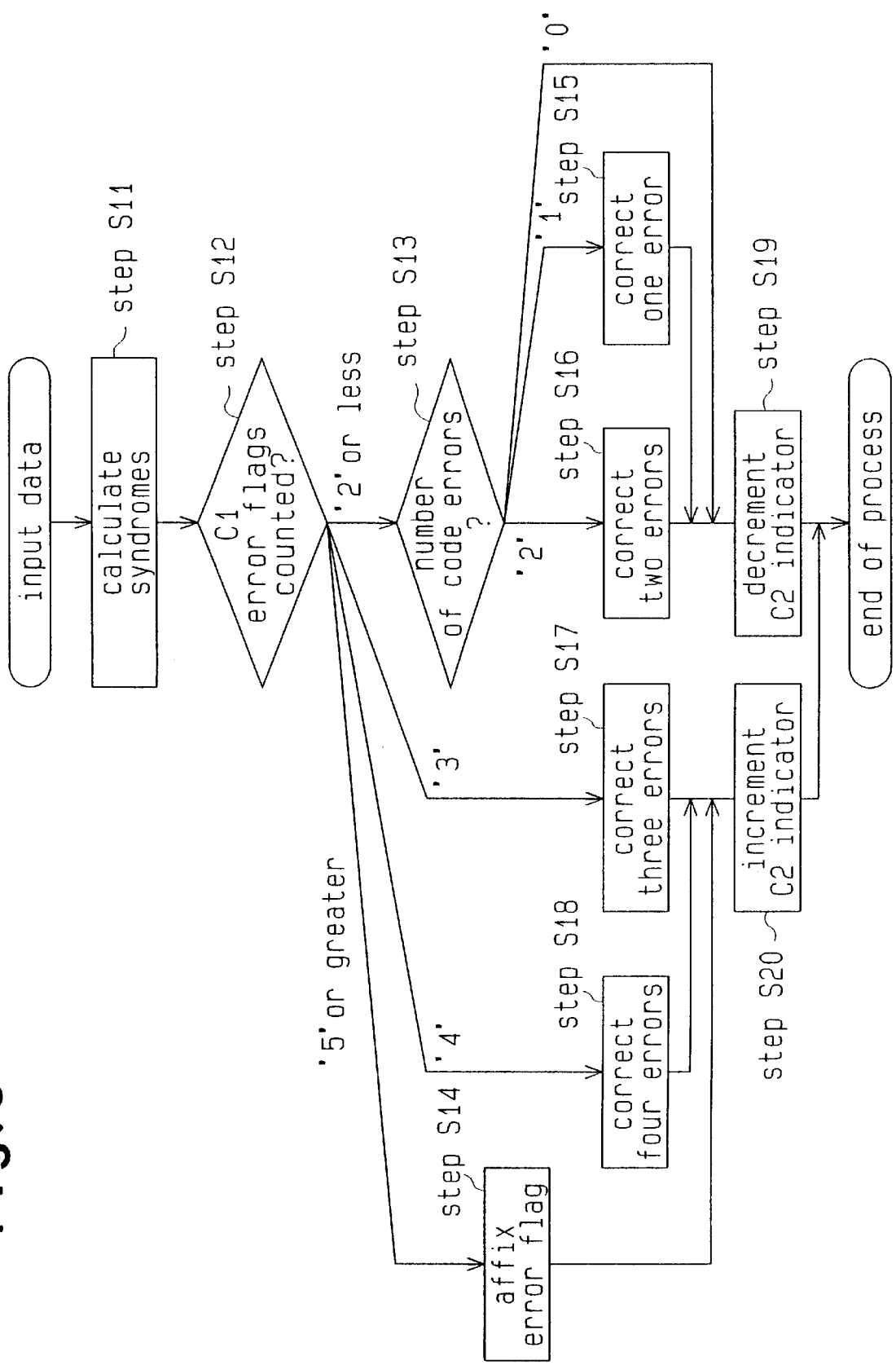
FIG. 3 is a flowchart illustrating the second processing stage in the code error correcting method according to one embodiment of the invention.
Figure 4:
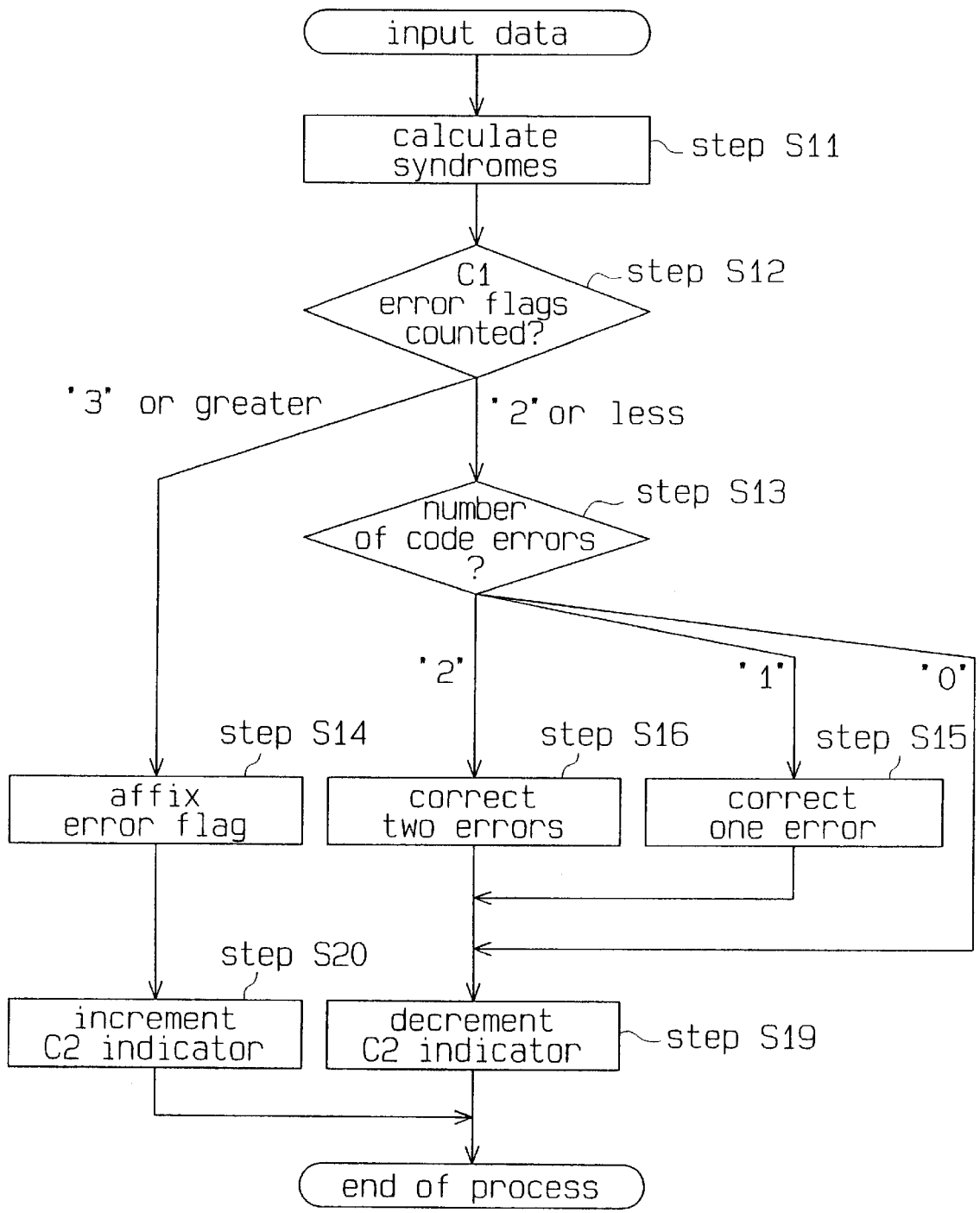
FIG. 4 is a flowchart showing the second processing stage with some processes in FIG. 3 being omitted.

A code error correcting method according to one embodiment of the present invention preferably a the first stage as shown in FIG. 2 and second stages as shown in FIGS. 3 and 4. In the first stage, a maximum of two code errors in 32 pieces (one frame) of symbol data may be detected and corrected. The processing starts when 32 pieces of symbol data D0 to D31, which are acquired by EFM demodulation of an EFM signal read from a CD are input to a code error correcting circuit. The 32 pieces of symbol data D0–D31 include four symbols of C1 codes.

In step S1, four syndromes S0, S1, S2 and S3 for one frame of symbol data are calculated according to the following equation 1 which is associated with the arrangement rules for C1 codes:

$$S0=D0+D1+D2+\ldots+D30+D31 \quad S1=\alpha^{31} D0+\alpha^{30}D1+\alpha^{29}D2+\ldots +\alpha D30+D31 \quad S2=\alpha^{62} D0+\alpha^{60}D1+\alpha^{58}D2+\ldots+\alpha D30+D31 \quad S3=\alpha^{93} D0+\alpha^{90}D1+\alpha^{87}D2+\ldots+\alpha D30+D31 \quad (1)$$

where $\alpha$ is the root of a primitive polynomial $[f(x)=x^8+x^4+x^3+x^2+1]$. The arithmetic operations in the equation 1 use a Galois field, and addition, (i.e., "+") for example, represents an exclusive logical sum. Accordingly, Galois fields are used in arithmetic operations in equations 2 to 7 which will be described below.

In step S2, it is decided based on four syndromes S0, S1, S2 and S3 if one frame of symbol data D0–D31 contains any data in error. C1 codes are affixed in such a way that the four syndromes S0–S3 acquired through arithmetic operations on one frame of symbol data D0–D31 all become "0". When the four syndromes S0–S3 are all "0". Therefore, it is decided that the symbol data D0–D31 contains no code errors. When the following equation 2 is met, it is decided that the symbol data D0–D31 contains one code error. When the following equation 3 is satisfied, it is decided that the symbol data D0–D31 contains two code errors. When neither the equation 2 nor the equation 3 is satisfied, it is decided that the symbol data D0–D31 contains three or more code errors.

$$S1/S0=S2/S1, \ S2/S1=S3/S2 \ S0\neq 0, \ S1\neq 0, \ S2\neq 0, \ S3\neq 0 \quad (2)$$

$$\alpha^i+\alpha^j=(S1\cdot S2+S0\cdot S3)/S1^2+S0\cdot S2 \ \alpha^{i+j}=(S2^2+S1\cdot S3)/S1^2+S\cdot 0S2 \ i, \ j=0 \text{ to } 31, \ i\neq j \quad (3)$$

Based on the results of the decision on a code error in step S2, the processes in steps S3 to S8 are performed. When no code errors are present, the decrementing operation of a C1 error indicator is performed in step S3 after which the flow proceeds to step S9. The C1 error indicator continuously monitors the number of code errors using C1 codes, and the number of code errors is incremented or decremented in a frame by frame manner. Therefore, this C1 error indicator shows the error status of old frames. When one code error is included, the decrementing operation of the C1 error indicator is performed in step S4 and error correction on the one code error is performed in step S7 after which the flow proceeds to step S9. When the decrementing operation is continuously performed for a predetermined number of frames in step S3 or step S4, the C1 error indicator is reset to initialize the number of code errors.

When two code errors are included, the incrementing operation of the C1 error indicator is performed in step S5 and error correction on the two code errors is performed in step S8 after which the flow proceeds to step S9. When three or more code errors are included, the incrementing operation of the C1 error indicator is performed in step S6 after which the flow skips step S9 to go to step S10. When the incrementing operation is continuously performed for a predetermined number of frames in step S5 or step S6, the C1 error indicator is set to settle an error flagging condition.

In step S9, the status of the old C1 error indicators for several frames of symbol data are decided. When the C1 error indicator is in the set status, an error flag is affixed to the symbol data D0–D31 in step S10 after which code error correction using C1 codes will be terminated. This error flag is affixed in association with the number of code errors. When there is a reset C1 error indicator, code error correction will be terminated without adding any error flag.

The code error correction in step S7 is executed using the following equation 4. The position of a code error is detected by the index of a acquired by the computation of the equation 4 using the syndromes S0 and S1.

$$S1/S0=\alpha^i \quad (4)$$

Suppose that the position of a code error is p (p=0 to 31) and that symbol data Dp is shifted by a value Y by the code error. In this case, from equation 1, S0=Y, and $S1=\alpha^{(31-p)}\cdot Y$ are obtained.

From equation 4, therefore, the position p of the code error is detected as "31−i" and the value Y of the shift caused by the code error is acquired from S0. The code error is corrected by adding this value Y to the symbol data Dp. When the result of the computation in the equation 4 is $\alpha^{29}$, for example, the symbol data D2 has a code error. This code error is corrected by adding the syndrome S0=Y to this symbol data D2. In other words, the value of a shift caused by one code error substantially matches with the syndrome S0. Addition of this shift value to the symbol data associated with the position of a code error can therefore correct the code error.

The results of arithmetic operations on the syndromes S2 and S3 are not directly needed for code error correction. However, those computation results can be used to check the effect of code error correction using the following equation 5.

$$S2+(\alpha^i)^2 \cdot Y=0 \quad S3+(\alpha^i)^3 \cdot Y=0 \tag{5}$$

The code error correction in step S8 is executed as follows. Suppose that the positions of code errors are p and q (p, q=0 to 31; p≠q) and that symbol data Dp and Dq are shifted by values Y0 and Y1 by the code errors. In this case, from equation 1, S0=Y0+Y1, and
S1=$\alpha^{(31-p)} \cdot$Y0+$\alpha^{(31-q)} \cdot$Y1 are obtained.

As the indexes i and j of α are acquired as the solution to simultaneous equations of S0 and S1, therefore, the positions p and q of the code errors are respectively detected as "31−i" and "31−j" and the shift values Y0 and Y1 are acquired. The code errors are corrected by adding the values Y0 and Y1 to the symbol data Dp and Dq, respectively. That is, the calculation in the equation 3 using the syndromes S0–S3 is performed and the positions of the code errors are detected from the solutions of the quadratic simultaneous equations, which have been obtained through the calculation. Further, two shift values are obtained from the syndromes S0 and S1. Therefore, as those shift values are added to the two pieces of symbol data which are associated with the positions of the code errors, the code errors may be corrected.

When two or more code errors continuously occur over several frames in the above-described code error correction using C1 codes, the C1 error indicator is set. After the C1 error indicator is set, error flags are affixed to all of the symbol data D0–D31 regardless of the presence or absence of code errors. The affixing of the error flags continues until the C1 error indicator is reset (e.g., when one or less code error continuously occurs over several frames).

FIG. 3 is a flowchart illustrating the second stage in the code error correcting method according to this invention, and FIG. 4 is a flowchart showing the error correction some of the processes in FIG. 3 being omitted. In the error correction shown in FIG. 3, the error flag affixed in the first stage of error correction using C1 codes is referred to and for one frame of symbol data, four code errors at a maximum may be corrected.

The error correcting process starts when 28 pieces (i.e., one frame) of symbol data D0 to D27, which include four symbols of C2 codes are input. Those 28 pieces of symbol data D0–D27 are obtained in the first stage of error correction and are the 32 pieces of symbol data from which four pieces of symbol data associated with C1 codes are removed. Further, those 28 pieces of symbol data D0–D27 are rearranged in the order associated with C2 codes.

In step S11, four syndromes S0, S1, S2 and S3 are calculated according to the following equation 6 which uses C2 codes:

$$S0=D0+D1+D2+\ldots+D26+D27 \quad S1=\alpha^{27}D0+\alpha^{26}D1+\alpha^{25}D2+\ldots+\alpha D26+D27 \quad S2=\alpha^{54}D0+\alpha^{52}D1+\alpha^{50}D2+\ldots+\alpha D26+D27 \quad S3=\alpha^{81}D0+\alpha^{78}D1+\alpha^{75}D2+\ldots+\alpha D26+D27 \tag{6}$$

In step S12, the number of code errors is decided on the basis of the number of symbol data D0–D27 affixed error flags in the first stage of error correction using C1 codes. Then, processes according to the number of code errors are performed in steps S13 to S18.

When the number of code errors is equal to or less than "2", the flow proceeds to step S13 where the error status of 28 pieces of symbol data D0–D27 are decided in the same way as done in step S2, based on the four syndromes S0–S3. When it is decided that there are no code errors because of the syndromes S0–S3 all being "0", the decrementing operation of a C2 error indicator is performed in step S19 after which the code error correction will be terminated.

When the equation 2 is satisfied and the presence of one code error is decided, error correction on one code error is performed in step S15 in the same way as done in step S7, and the error correction will be terminated after executing the process in step S19. When the equation 3 is satisfied and the presence of two code errors is decided, error correction on two code errors is performed in step S16 in the same way as done in step S8, and the error correction will be terminated after executing the process in step S19.

When it is decided in step S12 that there are five or more code errors, which are more than what can be corrected by the error correction, error flags are affixed to the symbol data D0–D27 in step S14. Through this process, it is apparent that all the symbol data D0–D27 contain code errors. In the next step S20, the incrementing operation of the C2 error indicator is performed after which the error correction will be terminated.

When it is decided that there are three code errors, error correction on those code errors is performed in step S17, and the incrementing operation of the C2 error indicator is performed in step S20 after which the error correction will be terminated. The error correction on three code errors in step S17 is executed as follows. In this error correction, the positions of the code errors have already been specified by the error flags affixed to the individual symbol data D0–D27. The specified positions of the code errors are therefore used in computing shift values. Suppose that the previously specified positions of the code errors are p, q and r and that the values of shifts caused by the code errors are Y0, Y1 and Y2, respectively. In this case, the following are the results of the calculation of equation 6:

$$S0=Y0+Y1+Y2, \quad S1=\alpha^{(27-p)} \cdot Y0+\alpha^{(27-q)} \cdot Y1+\alpha^{(27-r)} \cdot Y2, \quad S2=\alpha^{(54-2p)} \cdot Y0+\alpha^{(54-2q)} \cdot Y1+\alpha^{(54-2r)} \cdot Y2, \text{ and } S3=\alpha^{(81-3p)} \cdot Y0+\alpha^{(81-3q)} \cdot Y1+\alpha^{(81-3r)} \cdot Y2.$$

Thus, the individual shift values Y0, Y1 and Y2 can be obtained as solutions of the third-order simultaneous equations using the syndromes S0–S2. The syndrome S3 is not directly needed in the code error correction. However, the syndrome S3 can be used to check the effect of code error correction.

When it is decided in step S12 that there are four code errors, error correction on the four code errors is performed in step S18, and the incrementing operation of the C2 error indicator is performed in step S20 after which the error correction will be terminated. The specified four code error positions are also used in computing shift values in the code error correction in step S18 as in step S17. Suppose that the specified code error positions are p, q, r and s and that the individual shift values are Y0, Y1, Y2 and Y3, respectively. In this case, the results of the calculation in the equation 6 are as shown below:

$$S0=Y0+Y1+Y2+Y3, \quad S1=\alpha^{(27-p)} \cdot Y0+\alpha^{(27-q)} \cdot Y1+\alpha^{(27-r)} \cdot Y2+\alpha^{(27-s)} \cdot Y3$$
$$S2=\alpha^{(54-2p)} \cdot Y0+\alpha^{(54-2q)} \cdot Y1+\alpha^{(54-2r)} \cdot Y2+\alpha^{(54-2s)} \cdot Y3, \text{ and}$$
$$S3=\alpha^{(81-3p)} \cdot Y0+\alpha^{(81-3q)} \cdot Y1+\alpha^{(81-3r)} \cdot Y2+\alpha^{(81-3s)} \cdot Y3.$$

Thus, the individual shift values Y0, Y1, Y2 and Y3 can be obtained as solutions of the fourth-order simultaneous equations using the syndromes S0–S3.

As shown in FIG. 4, with respect to one frame of symbol data, a maximum of two code errors are corrected in the error correction with some processes omitted. The flow from the input of 28 pieces of symbol data D0–D27 to the computation of the syndromes S0–S3 in step S11 is the same as that in the flowchart shown in FIG. 3.

In step S12, the number of error flags affixed to the individual symbol data D0–D27 is counted to decide the number of code errors. When the number of code errors is equal to or less than "2", the processes in steps S13, S15 and S16, same as those shown in FIG. 3, are performed and the decrementing operation of the C2 error indicator is performed in step S19. Then, the code error correction using C2 codes will be terminated. When there are three or more code errors, the code error correcting processes (steps S17 and S18) are omitted and error flags are affixed to the individual symbol data D0–D27 in step S14. Then, the incrementing operation of the C2 error indicator is performed in step S20 after which the error correction will be terminated.

Like the C1 error indicator, the C2 error indicator is provided to monitor the error status of old code frames. When the incrementing operation is continuously performed with respect to a predetermined number of frames, the C2 error indicator is set to settle the C2 decoding process selection. When the decrementing operation is continuously performed with respect to a predetermined number of frames, the C2 error indicator is reset to initialize the C2 decoding process selection.

The incrementing operation of the C2 error indicator is executed not only in step S20 but also when an error occurs in each of the code error correcting processes (steps S15–S18). Therefore, when the C2 error indicator is set, it is decided that the symbol data D0–D27 contain numerous code errors which make the accurate error correction difficult. In this case, the normal error correction illustrated in FIG. 3 is switched to the error correction in FIG. 4 which is the error correction in which some processes (steps S17 and S18) are omitted from the normal error correction until the status is changed to the reset status from the set status. As an advantage, wasteful arithmetic operations for symbol data, which has too many code errors to accomplish accurate error correction, are omitted. Further, this prevents the power consumption of the arithmetic operation circuit from increasing.

Figure 5:
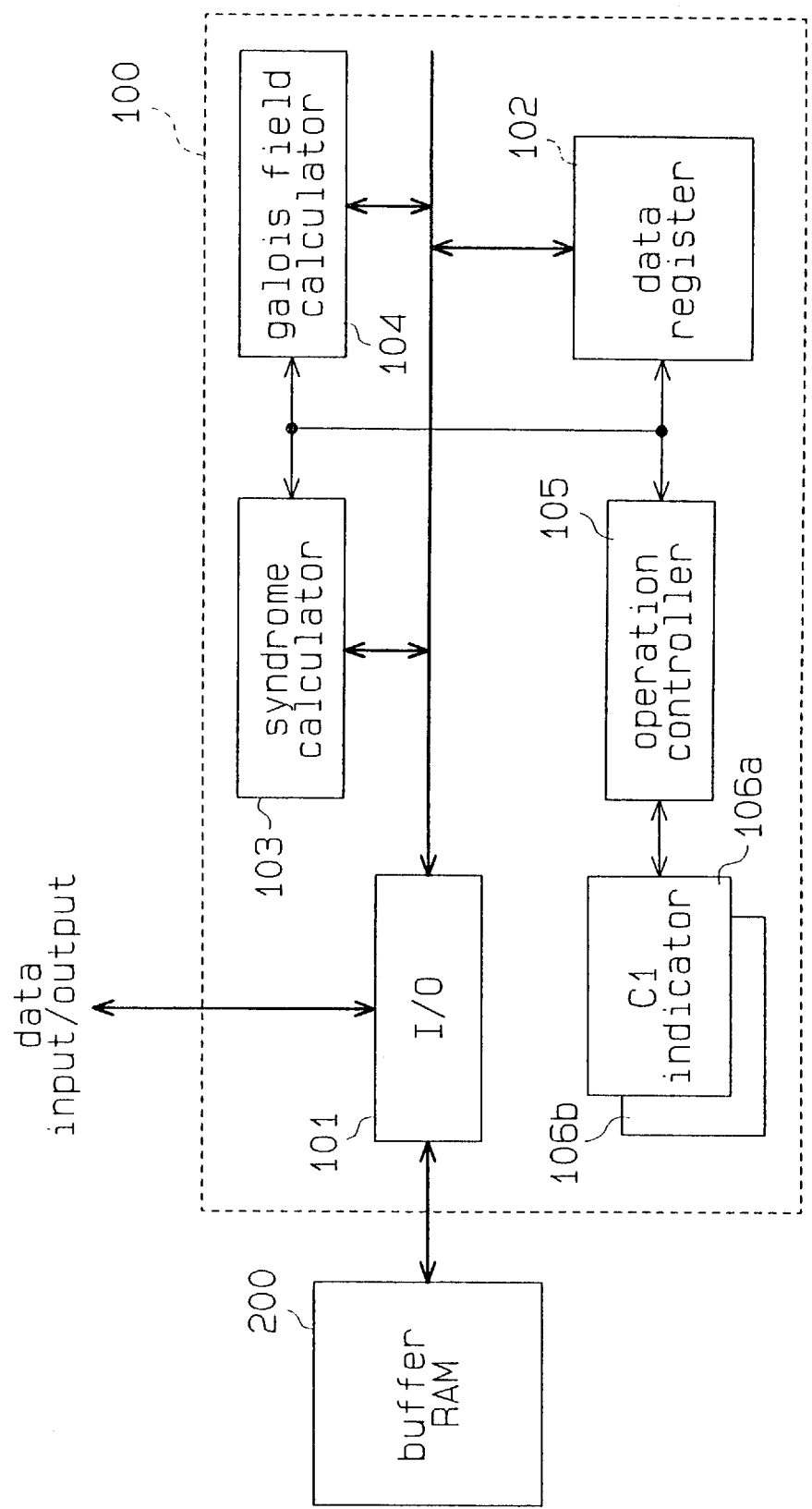
FIG. 5 is a block diagram illustrating a code error correcting circuit according to one embodiment of the invention.

FIG. 5 is a block diagram showing a code error correcting circuit according to one embodiment of the invention. The error correcting circuit 100 includes an input/output (I/O) circuit 101, a data register 102, a syndrome calculator 103, a Galois field calculator 104, an operation controller 105, a C1 error indicator 106a associated with error correction using C1 codes, and a C2 error indicator 106b associated with error correction using C2 codes.

The I/O circuit 101, connected to a buffer RAM 200, handles the input and output of symbol data to and from an external unit (not shown) and accesses symbol data in the buffer RAM 200. The buffer RAM 200 is preferably capable of storing at least one frame of symbol data. The I/O circuit 101 is further connected to the data register 102, the syndrome calculator 103 and the Galois field calculator 104.

The data register 102 stores the operation results in code error correction, data representing the positions of code errors, and data representing values of shifts caused by the code errors. Those data are produced by the Galois field calculator 104. The data register 102 is controlled by the operation controller 105 in such a way as to temporarily store individual pieces of data, while error correction on one frame of symbol data is being executed.

The syndrome calculator 103 receives symbol data from the buffer RAM 200 via the I/O circuit 101, and sequentially calculates four syndromes in accordance with the root of an eighth-order primitive polynomial. After computing the syndromes, this syndrome calculator 103 holds the computed syndromes while error correction on one frame of symbol data is being executed.

The Galois field calculator 104 executes an arithmetic operation of a Galois field to produce data representing the positions of code errors, and data representing the values of shifts caused by the code errors. Specifically, in accordance with predetermined rules, the positions of code errors and the shift values are calculated by executing an arithmetic operation using the syndromes computed by the syndrome calculator 103 and the data temporarily stored in the data register 102.

The Galois field calculator 104 further receives symbol data, which is associated with data representing the position of any code error and includes a code error, from the buffer RAM 200 via the I/O circuit 101. The calculator 104 adds data representing the value of shifts caused by any code errors to the received symbol data to correct the associated code error. The error-corrected symbol data is stored again in the buffer RAM 200 via the I/O circuit 101.

The operation controller 105 includes a programmable ROM (not shown) where control programs for performing arithmetic operations are stored, and controls the operations of the calculators 103 and 104 and the holding operation of the data register 102 in accordance with the control programs. The operation controller 105, which is further connected to the C1 and C2 error indicators 106a and 106b, switches the operation method for error correction to be executed in the calculators 103 and 104 from one to the other in accordance with the contents of the error indicators 106a and 106b. Specifically, when the C2 error indicator 106b is set, the arithmetic operation according to the flowchart in FIG. 3 is switched to the arithmetic operation according to the flowchart in FIG. 4. Therefor, even if the number of code errors increases, the individual calculators 103 and 104 do not continuously operate near their operational limits. This reduces some burden on the circuit operation, so that arithmetic operations for accurately checking the results of code error correction can be performed.

Figure 6:
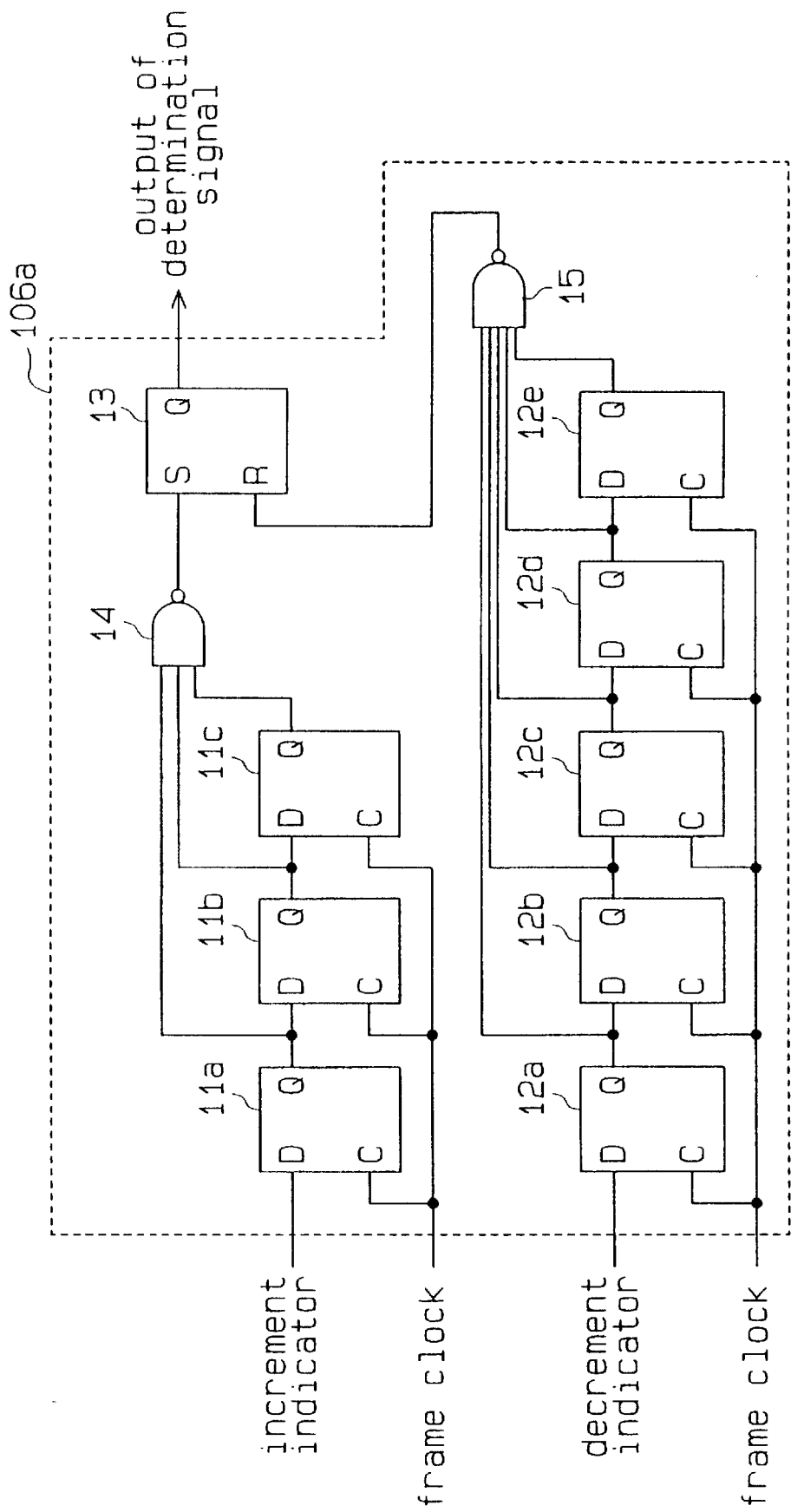
FIG. 6 is a block diagram illustrating an error indicator in the circuit of FIG. 5.

The C1 and C2 error indicators 106a and 106b continuously store the status of occurrence of code errors in a frame by frame manner. FIG. 6 presents a block diagram exemplifying the C1 error indicator 106a. Since the C2 error indicator 106b has the same structure as the C1 error indicator 106a, its description will not be repeated for ease of understanding. The error indicator 106a includes three stages of D flip-flops 11a to 11c, five stages of D-type flip-flops 12a to 12e, an SR-type flip-flop 13, a 3-input NAND gate 14 and a 5-input NAND gate 15.

The three stages of D flip-flops 11a–11c serve as three stages of shift registers which operate in accordance with a frame clock. The frame clock is synchronous with the frame period of symbol data. The first-stage D flip-flop 11a receives an increment signal from the operation controller 105. The individual D flip-flops 11a–11c supply their output signals to the respective inputs of the NAND gate 14.

The five stages of D flip-flops 12a–12e serve as five stages of shift registers which operate in accordance with the frame clock. The first-stage D flip-flop 12a receives a decrement signal from the operation controller 105. The individual D flip-flops 12a–12e supply their output signals to the respective inputs of the NAND gate 15.

The SR flip-flop 13 has a set terminal for receiving the output signal of the NAND gate 14, a reset terminal for receiving the output signal of the NAND gate 15, and an output terminal for supplying its output signal or an error indicator decision signal to the operation controller 105. In accordance with the decision signals from the error indicators 106a and 106b, the operation controller 105 switches the arithmetic operations as indicated by the flowcharts in FIGS. 2 to 4.

The frame clocks which are supplied to the C1 and C2 error indicators 106a and 106b have phases that the timing for error correction using C1 codes is synchronized with the timing for error correction using C2 codes.

In response to three consecutive increment signals, which are associated with three consecutive frames and each has a high (H) level, the three stages of D flip-flops 11a–11c in the C1 error indicator 106a supply H-level output signals to the NAND gate 14. In response to the output signal of the NAND gate 14 which has a low (L) level, the SR flip-flop 13 is set and outputs an H-level decision signal. When the H-level increment signals are not output continuously over about three or more frames, the NAND gate 14 outputs an H-level output signal. Therefore, the SR flip-flop 13 keeps outputting the decision signal associated with the error status of the previous frame.

In response to the five consecutive decrement signals, which are associated with five consecutive frames and each has an H level, the five stages of D flip-flops 12a–12e supply H-level output signals to the NAND gate 15. In response to the L-level output signal of the NAND gate 15, the SR flip-flop 13 is reset and outputs an L-level decision signal. When the H-level decrement signals are not output continuously over about five or more frames, the NAND gate 15 outputs an H-level output signal. Therefore, the SR flip-flop 13 keeps outputting the decision signal associated with the error status of the previous frame.

According to this embodiment, as described above, the occurrence of code errors is always monitored, so that arithmetic operations for one frame of symbol data can be executed only when code error correction is necessary. As described above, this feature can advantageously simplify circuit operation and thus reduce power consumption. Since the occurrence of code errors can be continuously monitored over a plurality of frames, it is also possible to perform more efficient and more accurate error correction.

Although only one embodiment of the present invention has been described herein, it should be apparent to those skilled in the art that the present invention may be embodied in many other specific forms without departing from the spirit or scope of the invention. Particularly, it should be understood that this invention may be embodied in the following forms.

The incrementing operation of the C1 error indicator which is executed in the first stage is not limited to the case where there are two or more code errors. Further, the incrementing operation of the C2 error indicator which is executed in the second stage is not limited to the case where there are three or more code errors. The C1 and C2 error indicators can be incremented when the number of code errors exceeds a predetermined value, and can be decremented when the number of code errors is less than the predetermined value. As a result, the predetermined number that is a reference in the decision can be set arbitrarily. When the number of code errors falls within a specific range, neither the incrementing operation nor the decrementing operation may be carried out. When the number of code errors in the first stage is "2" or when the number of code errors in the second stage is "3", for example, neither the incrementing operation nor the decrementing operation needs to be performed.

Therefore, the present examples and embodiment are to be considered as illustrative and not restrictive and the invention is not to be limited to the details given herein, but may be modified within the scope and equivalence of the appended claims.

What is claimed is:

1. A method of correcting code errors included in digital data, structured in units of frames, using first and second series of parity data, said method comprising the steps of:

computing a first group of syndromes for said digital data using said first series of parity data;

primarily deciding a number of code errors included in said digital data based on said first group of syndromes;

continuously monitoring said number of code errors included in said digital data for more than one frame at a time by setting an indicator, wherein said monitoring step includes the substeps of:

performing an increasing operation of the indicator when the number of code errors is greater than a first predetermined number, and performing a decreasing operation of the indicator when the number of code errors is equal to or smaller than the first predetermined number;

primarily correcting at least one code error using said first group of syndromes;

affixing an error flag to said digital data based on a result of monitoring said number of code errors;

computing a second group of syndromes for said digital data using said second series of parity data;

secondarily deciding a number of code errors included in said digital data based on said second group of syndromes and said error flag; and secondarily correcting at least one code error using said second group of syndromes.

2. The method according to claim 1, wherein said monitoring step further includes a step of setting an indicator to settle an error flagging condition when digital data having code errors whose quantity exceeds a first predetermined number continues over a second predetermined number of frames, and a step of resetting said indicator to initialize a flag setting condition when digital data having code errors whose quantity is less than a third predetermined number continues over a fourth predetermined number of frames; and wherein said error-flag affixing step includes a step of, when said indicator is set, affixing an error flag to said digital data.

3. The method according to claim 1, wherein in one frame, a number of code errors correctable by using said first series of parity data is limited to a second predetermined number; and wherein said error-flag affixing step includes a step of affixing an error flag to said digital data, when code errors whose quantity exceeds said second predetermined number are included in said digital data.

4. The method according to claim 3, wherein in one frame, a number of code errors correctable by using said second series of parity data is limited to a third predetermined number greater than said second predetermined number; and wherein said secondary decision step includes a step of deciding based on said error flag if said number of code errors exceeds said second predetermined number and is equal to or smaller than said third predetermined number or is greater than said third predetermined number.

5. The method according to claim 4, further comprising the step of affixing error flag to said digital data, when code errors whose quantity exceeds said third predetermined number are included in said digital data.

6. The method according to claim 4, further comprising, after said secondary decision step, a step of monitoring a number of code errors included in said digital data in a frame by frame manner, said monitoring step including a step of setting an indicator to settle an error flagging condition when digital data having code errors whose quantity exceeds said second predetermined number continues over a fourth predetermined number of frames, and a step of resetting said indicator to initialize a flag setting condition when digital data having code errors whose quantity is equal to or less than said second predetermined number continues over a fifth predetermined number of frames; and wherein when said indicator is set, said secondary correction step for code errors whose quantity is greater than said second predetermined number and is equal to or less than said third predetermined number is omitted, and an error flag is affixed to said digital data.

7. An apparatus for correcting code errors included in digital data, structured in units of frames, using first and second series of parity data included in said digital data, said apparatus comprising:

an input/output circuit for controlling input and output of digital data;

a buffer memory, connected to said input/output circuit, for storing said digital data;

a syndrome calculator for receiving digital data read from said buffer memory via said input/output circuit, and computing first and second groups of syndromes using said first and second series of parity data included in said digital data;

a Galois field calculator for performing a first syndrome calculation using said first group of syndromes and performing a first process of correcting at least one code error using a result of said first syndrome calculation, then performing a second syndrome calculation using said second group of syndromes and performing a second process of correcting at least one code error using a result of said second syndrome calculation, a number of code errors in said digital data and a position of said at least one code error being calculated in said first and second syndrome calculations;

a control circuit for controlling operations of said syndrome calculator and said Galois field calculator, setting a condition for said first process based on said number of code errors obtained in said first syndrome calculation, and setting a condition for said second process based on said number of code errors obtained in said second syndrome calculation; and, an error indicator, connected to said control circuit, for monitoring a number of code errors included in said digital data in a frame-by-frame manner, wherein said error indicator sets an indicator to settle an error flagging condition when digital data having code errors whose quantity exceeds a first predetermined number continues over a second predetermined number of frames, and resets said indicator to initialize a flag setting condition when digital data having code errors whose quantity is less than a third predetermined number continues over a fourth predetermined number of frames; and wherein when said indicator is set, said control circuit controls said Galois field calculator to affix an error flag to said digital data.

8. The apparatus according to claim 7, wherein in one frame, a number of code errors correctable in said first process is limited to a first predetermined number; and wherein when code errors whose quantity exceeds said first predetermined number are included in said digital data, said control circuit affixes an error flag to said digital data.

9. The apparatus according to claim 8, wherein in one frame, a number of code errors correctable in said second process is limited to a second predetermined number greater than said first predetermined number; and wherein said control circuit decides based on said error flag if said number of code errors exceeds said first predetermined number and is equal to or smaller than said second predetermined number or is greater than said second predetermined number.

10. The apparatus according to claim 9, wherein when code errors whose quantity exceeds said second predetermined number are included in said digital data, said control circuit affixes an error flag to said digital data.

11. The apparatus according to claim 9, further comprising an error indicator, connected to said control circuit, for monitoring a number of code errors included in said digital data in a frame by frame manner;

wherein said error indicator sets an indicator to settle an error flagging condition when digital data having code errors whose quantity exceeds said first predetermined number continues over a third predetermined number of frames, and resets said error indicator to initialize a flag setting condition when digital data having code errors whose quantity is equal to or less than said first predetermined number continues over a fourth predetermined number of frames; and wherein when said error indicator is set, said control circuit affixes an error flag without setting a condition for said second process for those code errors whose quantity is greater than said first predetermined number and is equal to or less than said second predetermined number, to said digital data.

12. The apparatus according to claim 7, further comprising a register, connected to said Galois field calculator and said control circuit, for temporarily storing data representing a number of code errors and a position of said at least one code error, calculated in said first and second syndrome calculations.

* * * * *